United States Patent [19]

Abo et al.

[11] Patent Number: 5,644,514
[45] Date of Patent: Jul. 1, 1997

[54] INTERPOLATION CIRCUIT FOR MEASURING DEVICE

[75] Inventors: Mitsuyoshi Abo; Toshihiko Kuga, both of Mobara, Japan

[73] Assignee: Futaba Denshi Kogyo K.K., Mobara, Japan

[21] Appl. No.: 601,510

[22] Filed: Feb. 14, 1996

[51] Int. Cl.$^6$ .............................. G01D 21/02; H04L 25/17
[52] U.S. Cl. ........................ 364/577; 356/4.09; 356/4.1; 356/363
[58] Field of Search ................... 364/577; 356/4.09, 356/4.1, 363, 356, 401

[56] References Cited

U.S. PATENT DOCUMENTS

| | | | |
|---|---|---|---|
| 4,577,968 | 3/1986 | Makosch | 356/356 |
| 5,177,770 | 1/1993 | Abo | 377/24 |
| 5,216,257 | 6/1993 | Brueck et al. | 250/548 |
| 5,283,434 | 2/1994 | Ishizuka et al. | 250/237 G |
| 5,288,995 | 2/1994 | Strachan | 250/227.12 |
| 5,343,292 | 8/1994 | Brueck et al. | 356/363 |

*Primary Examiner*—Ellis B. Ramirez
*Assistant Examiner*—Patrick J. Assouad
*Attorney, Agent, or Firm*—Oblon, Spivak, McClelland, Maier & Neustadt, P.C.

[57] ABSTRACT

An interpolation circuit for a measuring device capable of increasing a resolution and providing a velocity proportional output. Both sin θ signal and cos θ signal outputted from a sensor is fed to a balanced modulation adding circuit, resulting in providing a sin(ωt−θ) signal, which is then shaped into a pulse wave in a waveform shaping circuit. Then, a higher harmonic component is extracted by a BPF and then mixed with cos nωt and sin nωt signals in mixers, so that cos nθ and sin nθ signals are taken out of LPFs, respectively. The signals are subject to interpolation in a voltage comparison interpolation circuit of which the number of dividing is m, resulting in providing an interpolation circuit of which the whole number of dividing is m·n. Interpolation output A-phase and B-phase thereof each are a velocity proportional output.

2 Claims, 8 Drawing Sheets a: $\sin(\omega t+\theta)$ b: $\sin(\omega t+\theta)+\frac{1}{3}\sin(3\omega t+3\theta)+\frac{1}{5}\sin(5\omega t+5\theta)+\cdots$ c: $\sin(n\omega t+n\theta)$ d: $\sin n\omega t$       e: $\cos n\omega t$ f: $\cos n\theta - \cos(2n\omega t+n\theta)$       g: $\sin n\theta + \sin(2n\omega t+n\theta)$ h: $\cos n\theta$       i: $\sin n\theta$

A-PHASE

FIG. 11F
PRIOR ART

B-PHASE

INTERPOLATION CIRCUIT FOR MEASURING DEVICE

BACKGROUND OF THE INVENTION

This invention relates to a measuring device for measuring the magnitude of deviation such as movement, rotation or the like carried out between two objects, and more particularly to a measuring device generating an output proportional to a velocity of deviation.

In a machine tool or the like, it is conventionally known that it is critical in precision working to precisely measure movement of a tool in relation to a workpiece. For this purpose, various measuring devices have been developed and manufactured as a commercial product.

Figure 6A:
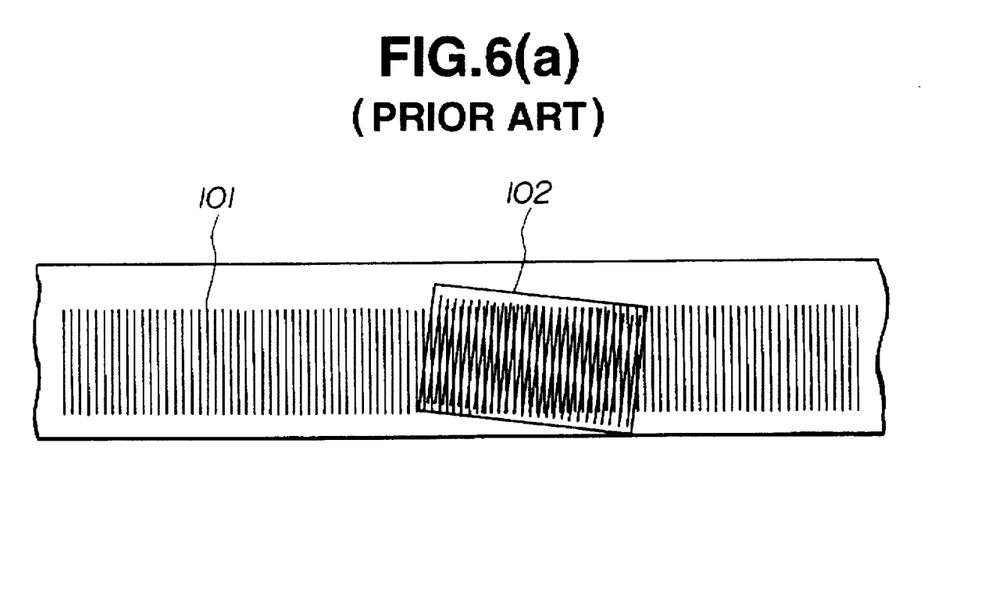
FIGS. 6(a) and 6(b) each are a schematic view showing a conventional optical scale.
Figure 6B:
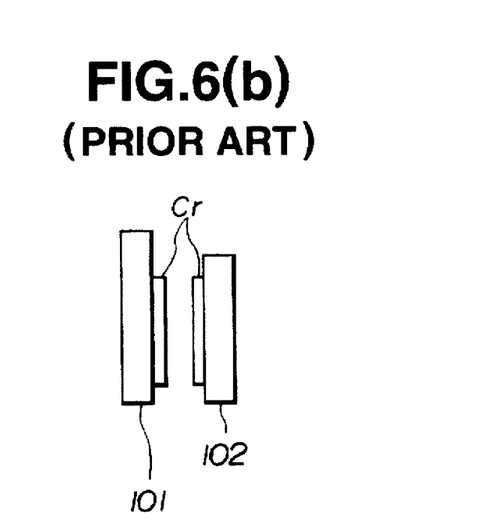

One of such conventional measuring devices is an optical scale utilizing a moire fringe obtained by superposing two optical lattices on each other. An optical scale which has been conventionally used for this purpose is typically constructed in such a manner as shown in FIGS. 6(a) and 6(b). More particularly, it includes a main scale 101 constituted by a lattice provided on a glass plate in such a manner that light-permeable sections and light-impermeable sections are arranged at predetermined intervals and an index scale 102 constituted by a lattice provided on a glass plate in such a manner that light-permeable sections and light-impermeable sections are arranged at predetermined intervals. The index scale 102 is arranged so as to be spaced at a microinterval from the main scale 101 and opposite to the main scale 101 while being kept inclined by a microangle with respect to the main scale 101.

The lattice thus arranged on each of the main scale 101 and index scale 102 is made by forming a film of Cr on one surface of the glass plate by vacuum deposition and then etching the Cr film to form indented lines at equal pitches on the glass plate.

Figure 8:
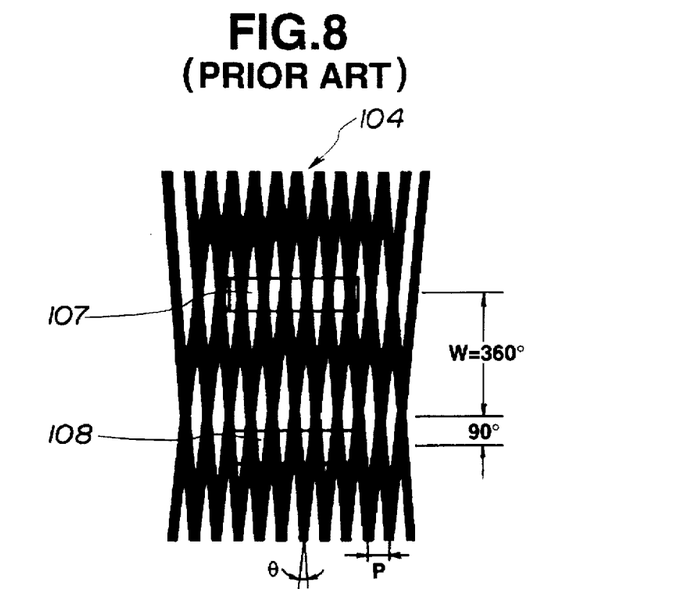
FIG. 8 is a schematic view showing an example of arrangement of a photoelectric transfer element for withdrawing a moire fringe and A-phase and B-phase signals.

Arrangement of the main scale 101 and index scale 102 in a manner to be opposite to each other at a microinterval causes occurrence of a moire fringe as shown in FIG. 8. The moire fringe has a cycle of W, resulting in producing darkness or brightness at every cycle W. Such darkness or brightness are downwardly or upwardly moved depending on a direction in which the index scale 102 is laterally moved relatively to the main scale When a pitch of the lattice of each of the main scale 101 and index scale 102 is indicated at P and an angle of inclination of the index scale 102 with respect to the main scale 101 is indicated at θ (tad), the cycle W of the moire fringe is represented by the following expression:

$$w = P/\theta$$

Thus, the cycle W of the moire fringe corresponds to a cycle obtained by optically magnifying the lattice pitch P by a factor of 1/θ. Therefore, movement of the lattice by P causes movement of the moire fringe by W, so that reading of a variation of W magnified permits the magnitude of movement of the lattice to be precisely measured.

Figure 7A:
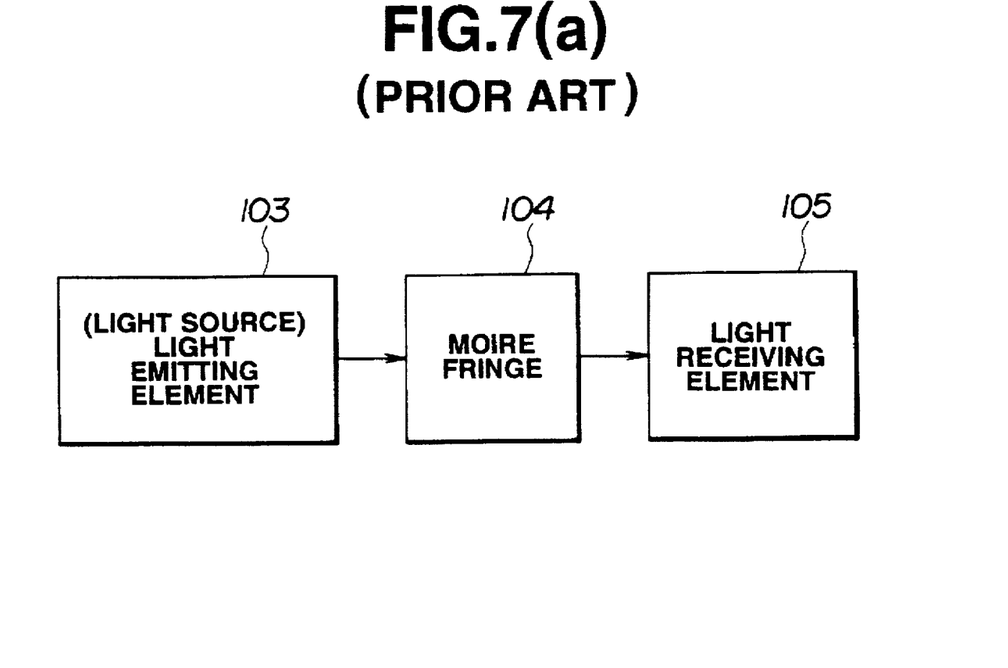
FIG. 7(a) is a block diagram showing a principle of a conventional optical scale.
Figure 7B:
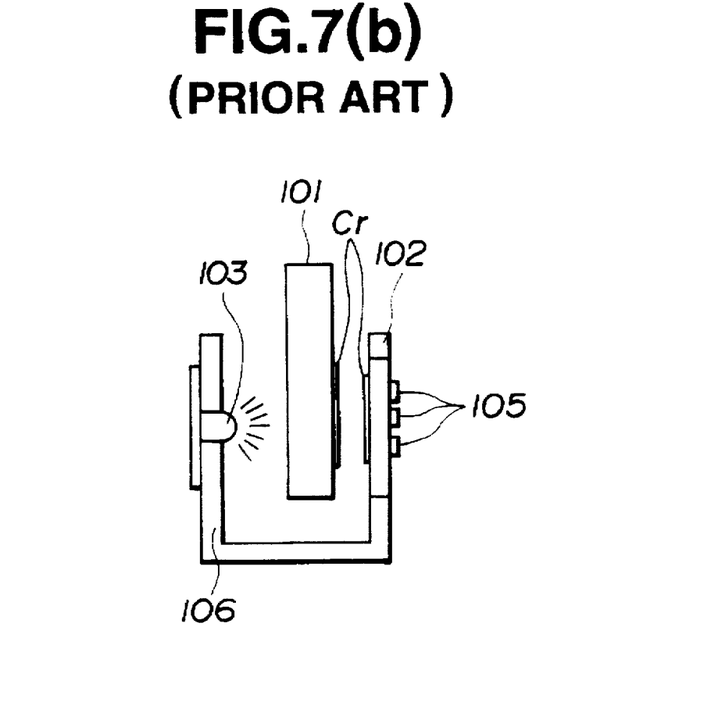
FIG. 7(b) is a schematic view front elevation view of the optical scale shown in FIG. 7(a)

In view of the above, in order to optically detect a variation of the moire fringe, a light emitting element 103 and a light receiving element 105 are arranged on a head body 106 provided with the index scale 102, as shown in FIGS. 7(a) and 7(b).

More particularly, as shown in FIG. 7(b), the head body 106 is provided on a side thereof opposite to the main scale 101 with the light emitting element (light source) 103, to thereby permit the light receiving element (photo-electric transfer element) 105 to receive light of the light emitting element 103 which has permeated the moire fringe, resulting in a variation of the moire fringe being optically detected.

Figure 9:
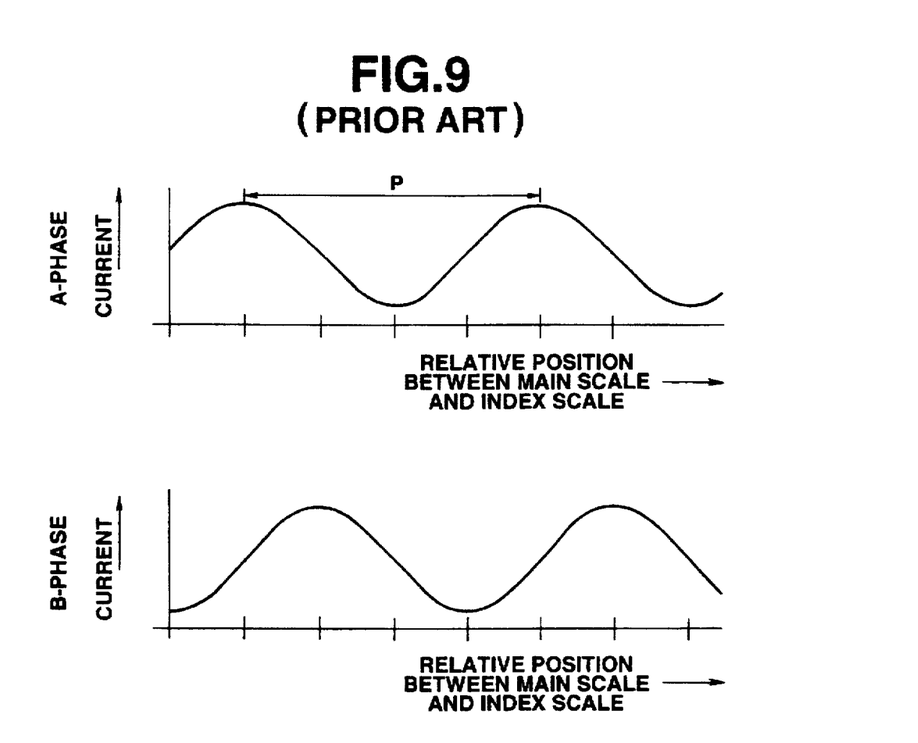
FIG. 9 is a diagrammatic view showing relationship between a relative position of a main scale to an index scale and a current output.

Reading of a variation in current flowing to the photoelectric transfer element 105 while moving the index scale 102 relatively to the main scale 101 indicates that the current is varied in a manner like a sine wave as shown in FIG. 9.

Thus, arrangement of two or A-phase and B-phase photoelectric transfer elements 107 and 108 while deviating them from each other by a sum of one cycle W (360°) and 90° causes a current flowing to the A-phase photoelectric transfer element 107 to have a waveform like a sine wave, as well as a current flowing to the B-phase photoelectric transfer element 108 to have a waveform like a cosine wave.

In this instance, a phase of a current flowing to the B-phase photoelectric transfer element 108 is advanced or delayed by 90° with respect to that of a current flowing to the A-phase photoelectric transfer element 107 depending on a direction of relative movement between the main scale 101 and the index scale 102, so that arrangement of the two photoelectric transfer elements while deviating them from each other by 90° permits deviation between both phases to be detected, resulting in a direction of relative movement therebetween being detected.

One cycle P of each of both A-phase signal and B-phase signal corresponds to movement of the index scale 102 by the pitch P of the lattice, so that counting of the A-phase signal and B-phase signal by a counter after waveform shaping of the signals permits a distance of movement of the index scale 102 to be measured.

In the optical scale described above, precise formation of the lattice on the glass plate requires that a pitch of the lattice is defined to be microns to tens of microns or more. Unfortunately, this fails to permit the optical scale to measure a distance of the movement as small as a sub-micron.

In order to solve the problem, an interpolation circuit is used which is adapted to divide the pitch of the lattice for interpolation, to thereby permit a distance of the movement below a sub-micron to be measured.

Figure 10:
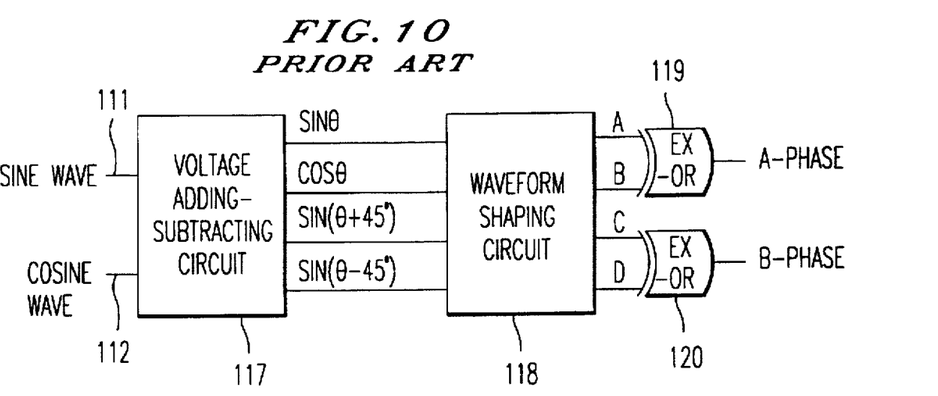
FIG. 10 is a block diagram showing an example of a conventional interpolation circuit.
Figure 11A:
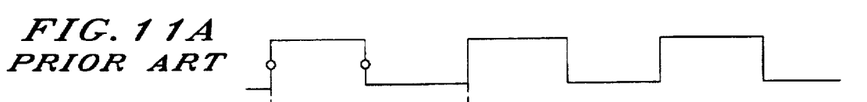
FIG. 11 is a group of waveform diagrams showing operation of the conventional interpolation circuit of FIG. 10.
Figure 11B:
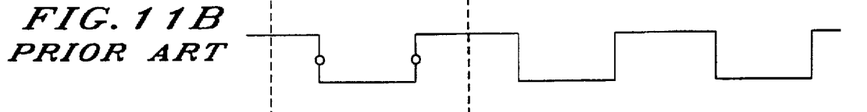
Figure 11C:
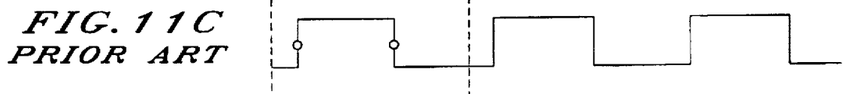
Figure 11D:
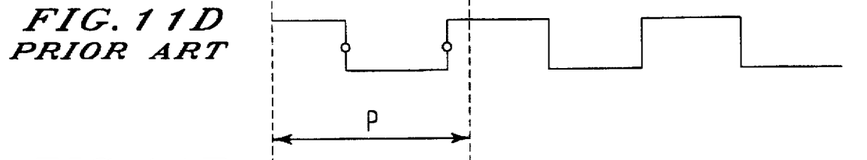
Figure 11E:
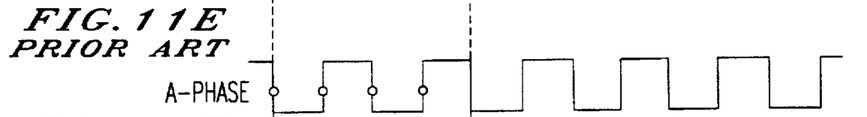
Figure 11F:
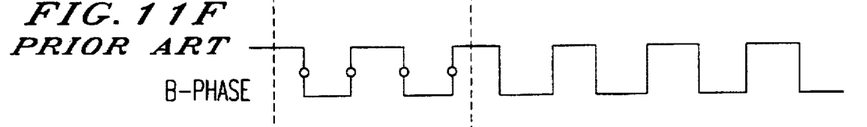

Such an interpolation circuit may be constructed in such a manner as shown in FIG. 10 by way of example.

In the interpolation circuit shown in FIG. 10, a sine wave 111 and a cosine wave 112 inputted to a voltage adding-subtracting circuit 117 are the same as the A-phase signal and B-phase signal shown in FIG. 9 and outputted in the form of a sin θ signal and a con θ signal from the voltage adding-subtracting circuit 117, respectively. Also, the voltage adding-subtracting circuit 117 adds the sine wave 111 and cosine wave 112 to each other to output a sin(θ+45°) signal therefrom and subtracts the cosine wave 112 from the sine wave 111 to output a sin(θ−45°) signal therefrom.

The four signals thus outputted from the voltage adding-subtracting circuit 117 are then inputted to a waveform shaping circuit 118, wherein the signals each are shaped into a pulse waveform, resulting in pulse signals indicated at a, b, c and d in FIG. 11 being provided.

In this instance, one cycle P of each of the sine wave 111 and cosine wave 112 constitutes a cycle P shown in FIG. 11. Then, the pulse signals a and b each are inputted to an exclusive OR circuit (EX-OR) 119, resulting in a pulse signal of which a frequency is doubled as indicated at an A phase in FIG. 11. Likewise, feed of each of the pulse signals c and d to an exclusive OR circuit (EX-OR) 120 provides a pulse signal of which a frequency is doubled as indicated at a B phase in FIG. 11.

Thus, the interpolation circuit outputs the pulse signals of the A and B phases of which a frequency is doubled. When a counter is to carry out counting each of the pulse signals at a leading edge of the signal and a trailing edge thereof, eight countings can be accomplished in one cycle P. Thus, interpolation of the pulse signal is increased by a factor of 8. Therefore, supposing that the pitch P of the lattice is 16 microns, a distance of the movement can be measured at a resolution of 2 microns.

Now, another conventional interpolation circuit, which is disclosed in Japanese Patent Application Laid-Open Publication No. 132104/1988, will be described with reference to FIG. 12.

Figure 12:
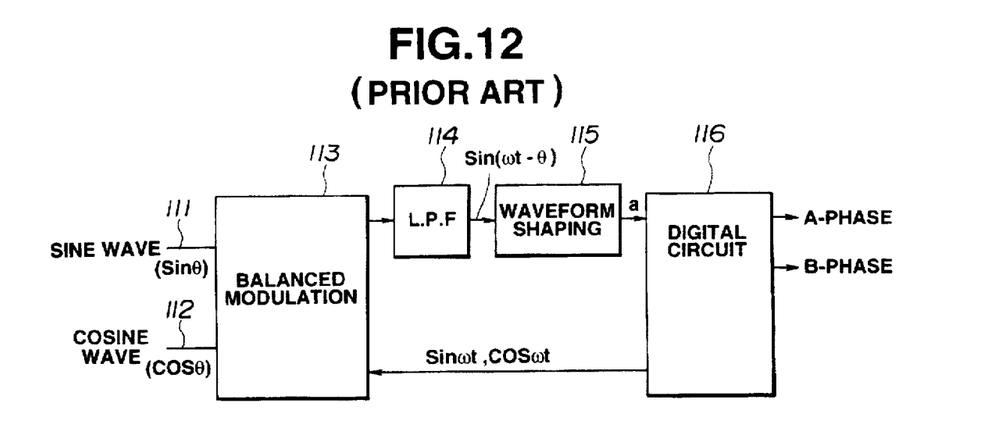
FIG. 12 is a block diagram showing another example of a conventional interpolation circuit.

In the interpolation circuit of FIG. 12, a sine wave 111 and a cosine wave 112 inputted to a balanced modulation adding circuit 113 are the A-phase signal and B-phase signal shown in FIG. 9, respectively. The balanced modulation adding circuit 113 subjects a sin ωt signal and a cos ωt signal fed in the form of a carrier from a digital circuit 116 to balanced modulation by means of the signals thus inputted, to thereby add the balanced modulated waves to the signals, followed by outputting of the signals. The output of the balanced modulation adding circuit 113 is then passed through a low-pass filter (LPF) 114, which extracts a sin(ωt−θ) signal component from the output and then feeds it to the waveform shaping circuit 115, resulting in it being shaped into a pulse signal.

The pulse signal is then fed to the digital circuit 116, so that the A-phase signal and B-phase signal interpolated are output therefrom.

Figure 13:
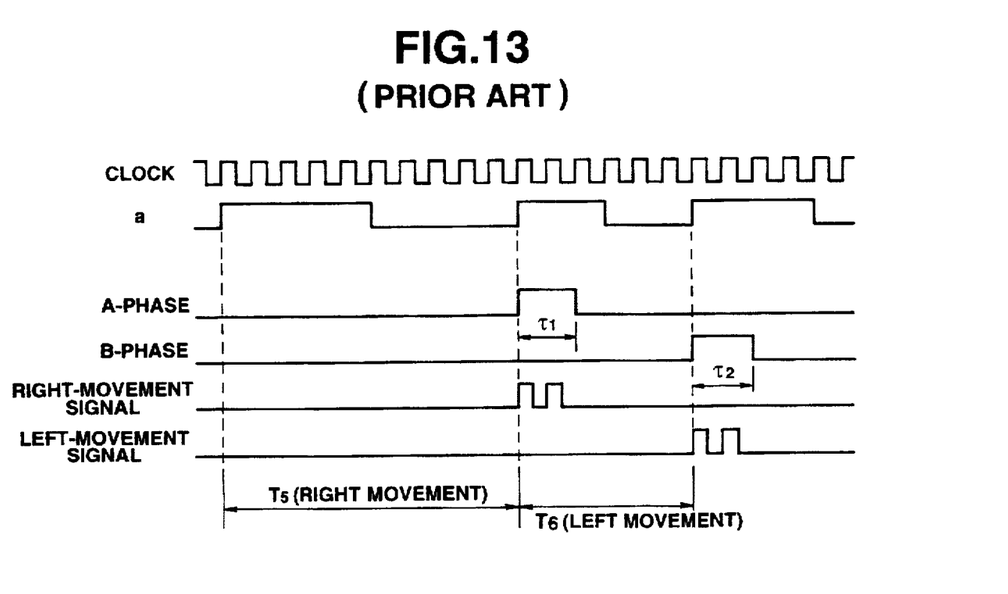
FIG. 13 is a group of waveform diagrams showing operation of the conventional interpolation circuit of FIG. 12.

The pulse signal a outputted from the waveform shaping circuit 115 has a phase subjected to phase modulation by the sine wave (sin θ) 111 and cosine wave (cos θ) 112 inputted thereto. More particularly, the pulse signal a has a width varied depending the magnitude of deviation of the index scale 102 and a direction of the deviation. Thus, as indicated at a in FIG. 13, the movement in a right-hand direction causes a pulse width of the pulse signal a to be increased, whereas the movement in a left-hand direction causes the width to be decreased.

A pulse width deviated from a reference width is outputted in the form of the A-phase signal (pulse width: t1) or the B-phase signal (pulse width: t2). The number of clocks shown in FIG. 13 which are within a pulse width of each of the A-phase and B-phase signals is counted, resulting in a value interpolated being obtained from the counter.

The carrier sin ωt and cos ωt signals are prepared by dividing frequencies of clocks counted by the counter. In this instance, a resolution of the interpolation circuit is determined by the number of dividing. More specifically, supposing that the number of dividing is 40, interpolation of 40 pulses is possible. Thus, when the pitch of the lattice is 40 microns, the scale exhibits a resolution of 1 micron.

However, the conventional interpolation circuit described above with reference to FIG. 10 fails to increase the number of interpolation (the number of dividing) due to an error of a resistance value in the voltage adding-subtracting circuit 117 and an error of offset of the waveform shaping circuit 115, resulting in failing to reducing a resolution.

Also, although the interpolation circuit shown in FIG. 12 improves a resolution by increasing the number of dividing, it fails to provide a velocity proportional output, to thereby fail to direct the output to other applications.

SUMMARY OF THE INVENTION

The present invention has been made in view of the foregoing disadvantage of the prior art.

Accordingly, it is an object of the present invention to provide an interpolation circuit for a measuring device which is capable of exhibiting an improved resolution and providing a velocity proportional output.

In accordance with the present invention, an interpolation circuit for a measuring device is provided. The interpolation circuit includes a balanced modulation circuit to which a sin θ signal varied in a manner like a sine wave and a cos θ signal varied in a manner like a cosine wave depending on the magnitude of deviation are fed in the form of a modulation signal, a waveform shaping circuit for shaping a waveform of a modulated wave having a phase of an angle θ which is generated by said balanced modulation circuit, an extraction means for extracting an n-th higher harmonic signal component of the modulated wave from an output of the waveform shaping circuit, a first mixer for mixing the n-th higher harmonic signal extracted by the extraction means with a frequency signal having a frequency n times as high as that of the modulated wave and a phase of 0°, a second mixer for mixing the n-th higher harmonic signal extracted by the extraction means with a frequency signal having a frequency n times as high as that of the modulated wave and a phase of 90°, and a voltage comparison interpolation circuit for carrying out voltage comparison interpolation of a cos nθ signal taken out of the first mixer and a sin nθ signal taken out of the second mixer to provide an m-divided interpolation output, to thereby output A-phase B-phase signals interpolated while keeping the whole number of dividing at m·n.

In a preferred embodiment of the present invention, at least two sets of combinations each of said waveform shaping circuit and extraction means are cascade-connected to each other.

BRIEF DESCRIPTION OF THE DRAWINGS

These and other object and many of the attendant advantages of the present invention will be readily appreciated as the same becomes better understood by reference to the following detailed description when considered in connection with the accompanying drawings; wherein:

FIG. 4A–4E are a group of waveform diagrams showing operation of the balanced modulation adding circuit of FIG. 3;

DETAILED DESCRIPTION OF THE PREFERRED EMBODIMENTS

Now, an interpolation circuit for a measuring device according to the present invention will be described hereinafter with reference to the accompanying drawings.

Figure 1:
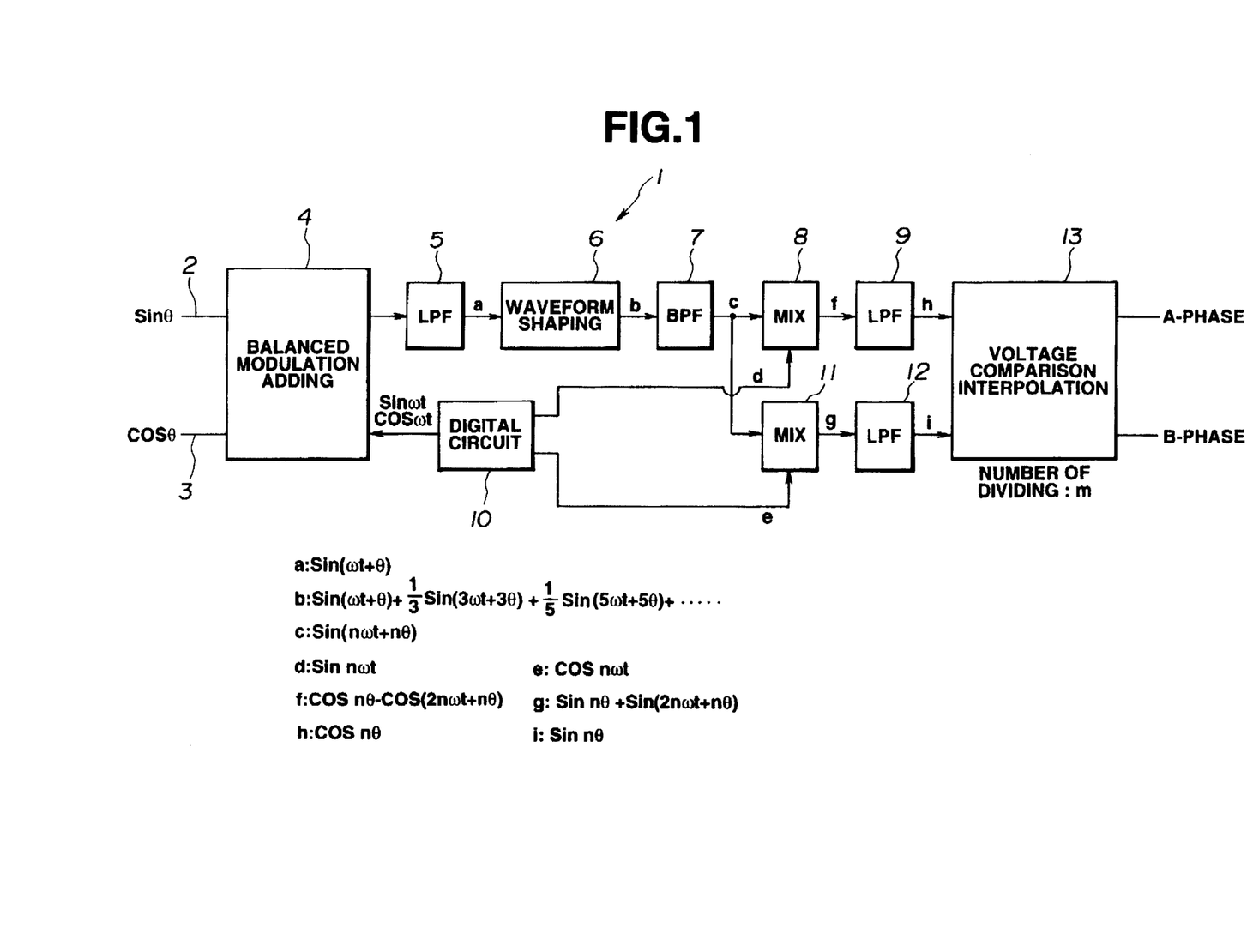
FIG. 1 is a block diagram showing an embodiment of an interpolation circuit for a measuring device according to the present invention.

Referring first to FIG. 1, an embodiment of an interpolation circuit for a measuring device according to the present invention is illustrated. In FIG. 1 in which an interpolation circuit of the illustrated embodiment is generally designated by reference numeral 1, reference numerals 2 and 3 designate a sin θ signal and a cos θ signal of a Lissajous waveform which are indicated as the A phase and B phase in FIG. 9 described above, respectively. 4 is a balanced modulation adding circuit for subjecting carrier signals sin ωt and cos ωt to balanced modulation by means of the sin θ signal and cos θ signal 2 and 3 to obtain two modulation signals and then carrying out adding of the two modulation signals, 5 is a low-pass filter (LPF) for extracting a fundamental wave component or sin(ωt+θ) component from an output of the balanced modulation adding circuit 4, and 6 is a waveform shaping circuit for waveform-shaping the sin (ωt+θ) signal outputted from the LPF 5 into a pulse signal.

Also, reference numeral 7 designates a band-pass filter (BPF) for extracting an n-th higher harmonic component from an output of the waveform shaping circuit 6, 8 and 11 are mixers (MIXs) for mixing the n-th higher harmonic component outputted from the BPF 7 with a sin nωt signal and a cos nωt signal fed from a digital circuit 10, respectively, and 9 and 12 are LPFs for extracting a sin nθ signal and a cos nθ signal from outputs of the mixers 8 and 11, respectively. The digital circuit 10 functions to feed a carrier to the balanced modulation circuit 4 and feed the mixers 8 and 11 with a frequency signal of a frequency n times as high as that of the carrier. Reference numeral 13 indicates a voltage comparison interpolation circuit for subjecting outputs of the LPFs 9 and 12 to voltage adding-subtracting to provide an output having a plurality of phases, to thereby generate both m-divided interpolation output A-phase and B-phase.

Now, the manner of operation of the interpolation circuit 1 of the illustrated embodiment thus constructed will be described hereinafter.

A sin θ signal 2 of a Lissajous waveform inputted to the balanced modulation adding circuit 4 is multiplied by a carrier cos ωt signal outputted from the digital circuit 10 and likewise a cos θ signal 3 is multiplied by a carrier sin ωt signal outputted from the digital circuit 10.

Thus, the balanced modulation adding circuit 4 carries out an operation of the following expression (1):

$$\sin\theta\cdot\cos\omega t + \cos\theta\cdot\sin\omega t = \sin(\omega t + \theta) \quad (1)$$

In this connection, the balanced modulation circuit 4 digitally carries out an operation as described hereinafter, therefore, an output of the balanced modulation adding circuit 4 contains a higher harmonic component in addition to a component represented by the above-described expression (1).

The LPF 5 is provided in order to eliminate such a higher harmonic component. For this purpose, the LPF 5 is adapted to output only a signal of a sin(ωt+θ) component, which is then inputted to the waveform shaping circuit 6. The waveform shaping circuit 6 shapes the sin(ωt+θ) signal into a pulse waveform, so that the waveform shaping circuit 6 outputs a signal b which consists of a fundamental wave of sin(ωt+θ) and an odd higher harmonic component thereof and is represented by the following expression (2):

$$b = \sin(\omega t + \theta) + \tfrac{1}{3}\sin(3\omega t + 3\theta) + \tfrac{1}{5}\sin(5\omega t + 5\theta) + \ldots \quad (2)$$

A phase of the odd higher harmonic component is nθ when it is an n-th higher harmonic.

Then, the BPF 7 extracts, from the output thus generated from the waveform shaping circuit 6, a sin(nωt+nθ) signal which is an n-th higher component signal c, which is then fed to the mixers 8 and 11.

The mixer 8 is fed with a d signal or a frequency signal sin nωt of a frequency n times as high as that of the carrier, which signal d is mixed with the above-described signal in the mixer 8, so that it outputs a cos nθ−cos(2nωt+nθ) signal.

The mixer 11 is fed with an e signal or a frequency signal cos nωt of a frequency n times as high as that of the carrier, which signal e is mixed with the above-described signal in the mixer 11, so that it outputs a sin nθ+sin(2nωt+nθ) signal.

The output signal of the mixer 8 is inputted to the LPF 9, so that only a cos θ signal is extracted, which is fed to the voltage comparison interpolation circuit 13. The output of the mixer 11 is inputted to the LPF 12, so that only a sin θ signal is extracted, which is then inputted to the voltage comparison interpolation circuit 13.

The voltage comparison interpolation circuit 13, when the number of dividing of the circuit 13 is eight, is constructed in substantially the same manner as the interpolation circuit described above with reference to FIG. 10, so that A-phase and B-phase outputs interpolated due to 8-dividing of a phase are provided.

The interpolation circuit shown in FIG. 10, as described above, is constructed so that voltage adding-subtracting provides sine and cosine signals having phases of (θ+45°) and (θ−45°). The interpolation circuit may be constructed so that voltage adding is carried out to provide four sine and cosine signals having phases of (θ+22.5°), (θ−22.5°), (θ+67.5°) and (θ−67.5°), resulting in providing 16-divided A-phase and B-phase signals.

Thus, supposing that the number of dividing of the voltage comparison interpolation circuit 13 is m, the whole number of dividing of the interpolation circuit 1 is m·n, so that the interpolation circuit 1 may provide A-phase and B-phase outputs interpolated by the number of dividing n·m. This permits the counter to count pulses of n·m in number when the index scale is moved by a distance corresponding to one pitch of the lattice, so that the interpolation circuit of the illustrated embodiment may improve or increase a resolution by a factor of m·n.

For example, a combination of n=5 and m=8 provides the number of dividing of 40. This permits the interpolation circuit 1 to provide a resolution of 0.4 micron when a pitch of the lattice is 16 microns and that of 1 micron when it is 40 microns.

Also, a combination of n=10 and m=16 provides the number of dividing of 160, so that the interpolation circuit may provide a resolution of 0.1 micron when the pitch is 16 microns.

Thus, the interpolation circuit of the illustrated embodiment exhibits an improved resolution and permits an output interpolated to provide a velocity proportional signal as in the A-phase and B-phase signals shown in FIG. 11.

In view of signal processing, it is desirable that the "n" of the n-th higher harmonic extracted by the BPF 7 is selected so as to provide a higher harmonic exhibiting an amplitude of a predetermined level or more. Also, the illustrated embodiment may be constructed so that the LPF 5 outputs a signal $\sin(\omega t-\theta)$. Such construction likewise permits the number of dividing to be m·n. In this instance, the sin θ signal 2 is multiplied by the carrier sin ωt signal and the cons θ signal 3 is multiplied by the carrier cos ωt signal, so that the two signals thus multiplied are added to each other.

Figure 2:
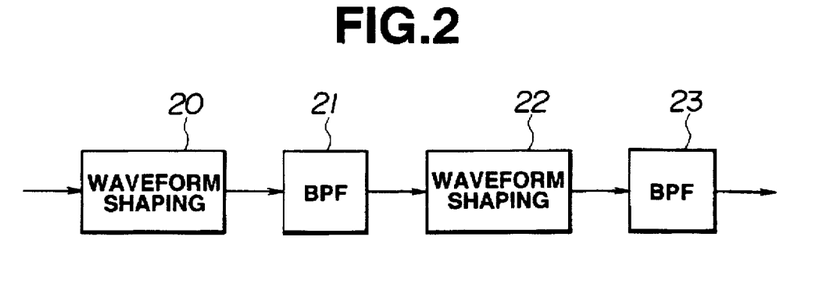
FIG. 2 is a block diagram showing another embodiment of an interpolation circuit for a measuring device according to the present invention which is constructed so as to further increase the number of dividing.

Also, the interpolation circuit of the present invention may be constructed in such a manner as shown in FIG. 2. In an interpolation circuit shown in FIG. 2, a BPF 21 cascade-connected to a waveform shaping circuit 20 extracts, from an output of the waveform shaping circuit 20, an n1-th higher harmonic component, which is further subject to waveform shaping in a waveform shaping circuit 22. Then, a BPF 23 cascade-connected to the waveform shaping circuit 22 extracts an n2-th higher harmonic component from the waveform-shaped signal. Thus, the n1- and n2-th higher harmonics are provided, resulting in the number of dividing of n=n1·n2 being provided.

Such construction shown in FIG. 2 permits the number of dividing n to be increased, to thereby further improve a resolution of the interpolation circuit.

Figure 3:
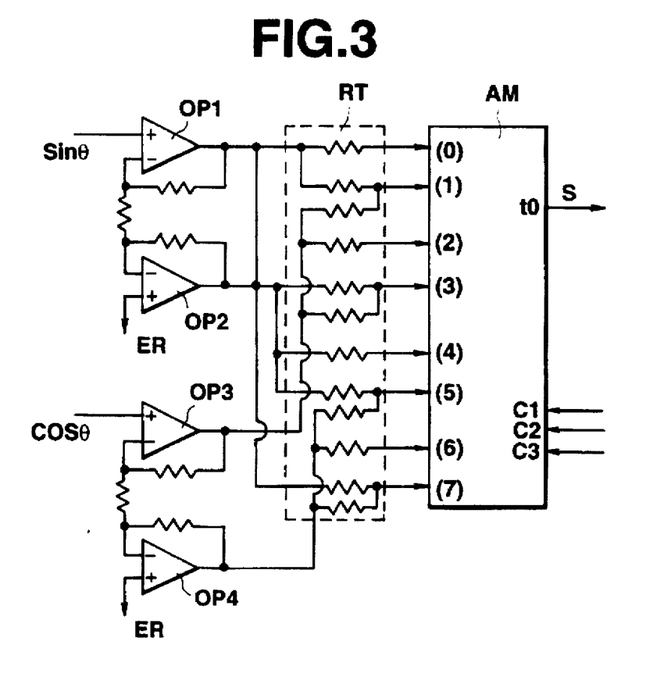
FIG. 3 is a circuit diagram showing an example of a balanced modulation adding circuit.

Now, the balanced modulation adding circuit 4 will be described hereinafter with reference to FIG. 3. In the balanced modulation adding circuit 4 shown in FIG. 3, the sin θ signal 2 is fed through an operational amplifier OP1 to a resistor circuit RT while being kept at a positive phase and concurrently fed to the resistor circuit RT while being inverted by an operational amplifier OP2. The cos θ signal 3 is fed through an operational amplifier OP3 to the resistor circuit RT while being kept at a positive phase and concurrently fed to the resistor circuit RT while being inverted by an operational amplifier OP4.

Thus, the resistor circuit RT prepares a plurality of mix signals having opposite phases and an identical voltage, which are fed to input terminals 0 to 7 of a modulation circuit AM, respectively. The modulation circuit AM includes input terminals C1, C2 and C3, which are fed with switching signals of a binary weighted pulse width shown in (a), (b) and (c) of FIG. 4, so that the modulation circuit AM decodes the three switching signals to select one of the mix signals inputted to the input terminals 0 to 7, to thereby output a signal S through an output terminal $4_0$.

This permits the balanced modulation adding circuit 4 to generate the output signal S comprising a $\sin(\omega t-\theta)$ signal containing a higher harmonic component, wherein the carrier sin ωt constitutes a fundamental wave of the switching signal shown in (b) of FIG. 4.

Figure 4A:
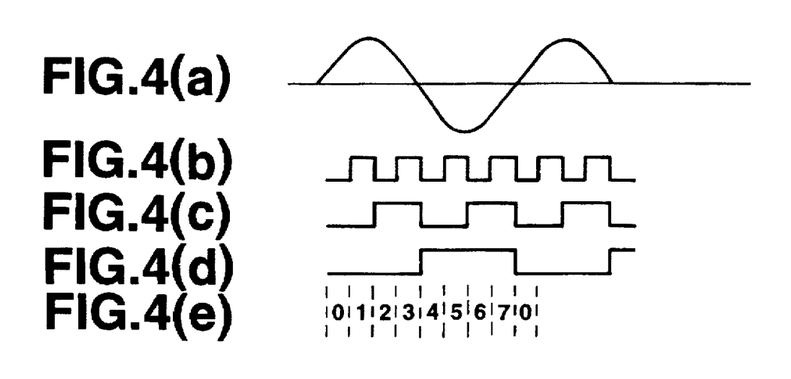

(a) of FIG. 4 shows a waveform of the sign θ signal input and (e) of FIG. 8 indicates 8-dividing of the input signal, which is detailedly described in Japanese Patent Application Laid-Open Publication No. 132104/1987, of which the disclosure is incorporated herein by reference.

Figure 5:
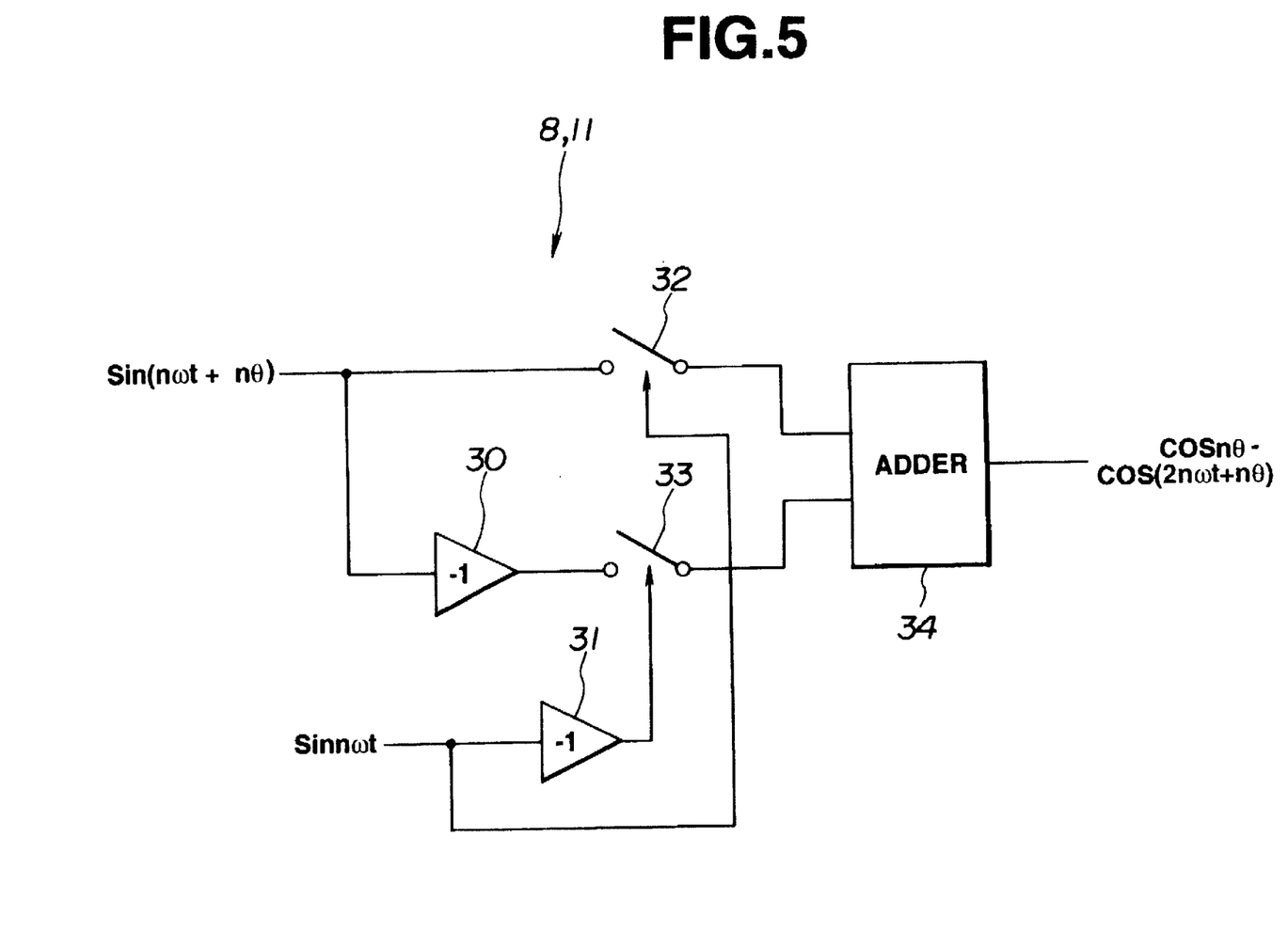
FIG. 5 is a circuit diagram showing an example of a mixer.

Now, each of the mixers 8 and 11 will be described hereinafter with reference to FIG. 5. In FIG. 5, a $\sin(n\omega t+n\theta)$ signal is inputted to a switch 32 and concurrently inputted to an inversion amplifier 30, resulting in being inverted into a $-\sin(n\omega t+n\theta)$ signal, which is then inputted to a switch 33. Operation of the switches 32 and 33 is carried out by a frequency signal sin nωt of a frequency n-times as high as that of the carrier and a signal −sin nωt obtained by inverting the signal, respectively.

Outputs of the switches 32 and 33 are synthesized by an adder 34, resulting in a mixer output $\cos n\theta - \cos(2n\omega t+\theta)$ being provided.

Thus, the mixer is fed with the signal $\sin(n\omega t+n\theta)$ to carry out switching of the switches 32 and 33 using the frequency signal cos nωt of a frequency n-times as high as that of the carrier as a control signal, resulting in providing a mixer output $\sin n\theta+\sin(2n\omega t+n\theta)$.

In each of the embodiments described above, a higher harmonic is generated for waveform-shaping a signal into a pulse waveform. Alternatively, both-wave rectification may be carried out in place of waveform shaping, to thereby generate an even higher harmonic.

As can be seen from the foregoing, the present invention is constructed so as to convert a sin θ signal and a cos θ signal inputted which have a Lissajous waveform into a sin nθ signal and a cos nθ signal having a phase n times that of the sin θ and cos θ signals, followed by voltage comparison interpolation. Such construction, even when the number of voltage comparison interpolation m is reduced, permits the whole number of dividing m n to be increased, resulting in improving a resolution.

Also, the present invention permits an output of the interpolation circuit to be a velocity proportional output, to thereby provide a linear motor scale wherein the output is used as a velocity feedback signal for a linear motor, resulting in eliminating a necessity of independently or separately arranging a structure for providing a velocity feedback signal.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An interpolation circuit for a measuring device, comprising:

a balanced modulation circuit to which a sin θ signal varied in a manner like a sine wave and a cos θ signal varied in a manner like a cosine wave depending on the magnitude of deviation are fed in the form of a modulation signal;

a waveform shaping circuit for shaping a waveform of a modulated wave having a phase of an angle θ which is generated by said balanced modulation circuit;

an extraction means for extracting an n-th higher harmonic signal component of said modulated wave from an output of said waveform shaping circuit;

a first mixer for mixing the n-th higher harmonic signal extracted by said extraction means with a frequency signal having a frequency n times as high as that of said modulated wave and a phase of 0°;

a second mixer for mixing the n-th higher harmonic signal extracted by said extraction means with a frequency signal having a frequency n times as high as that of said modulated wave and a phase of 90°; and a voltage comparison interpolation circuit for carrying out voltage comparison interpolation of a cos nθ signal taken out of said first mixer and a sin nθ signal taken out of said second mixer to provide an m-divided interpolation output, to thereby output A-phase B-phase signals interpolated while keeping the whole number of dividing at m·n.

2. An interpolation circuit as defined in claim 1, wherein at least two sets of combinations each of said waveform shaping circuit and extraction means are cascade-connected to each other.

* * * * *

UNITED STATES PATENT AND TRADEMARK OFFICE
CERTIFICATE OF CORRECTION

PATENT NO. : 5,644,514
DATED : July 1, 1997
INVENTOR(S) : Mitsuyoshi ABO, et al.

It is certified that error appears in the above-indentified patent and that said Letters Patent is hereby corrected as shown below:

On the title page, item [30], the Foreign Application Priority Data is missing, it should read:

--[30]    Foreign Application Priority Data

Feb. 15, 1995   [JP]   Japan   .............. 7-049281--

Signed and Sealed this

Sixteenth Day of September, 1997

Attest:

BRUCE LEHMAN

Attesting Officer        Commissioner of Patents and Trademarks